US005936557A

United States Patent [19]

Liddle

[11] Patent Number: 5,936,557

[45] Date of Patent: Aug. 10, 1999

[54] KEYPAD

[75] Inventor: Mark J.D. Liddle, Dundee, United Kingdom

[73] Assignee: NCR Corporation, Dayton, Ohio

[21] Appl. No.: 08/883,473

[22] Filed: Jun. 25, 1997

[30] Foreign Application Priority Data

Oct. 8, 1996 [GB] United Kingdom .................. 9620979

[51] Int. Cl.$^{6}$ .................................................. H03K 17/94

[52] U.S. Cl. .............................. 341/34; 341/22; 345/173; 200/512; 902/20

[58] Field of Search ........................ 341/22, 34; 200/512, 200/5 A; 361/679, 680, 746; 345/173; 902/20; 235/145 R

[56] References Cited

U.S. PATENT DOCUMENTS

| | | | |
|---|---|---|---|
| 4,543,563 | 9/1985 | Wine | 341/22 |
| 5,721,666 | 2/1998 | Girard | 361/627 |
| 5,747,757 | 5/1998 | Van Zeeland et al. | 200/512 |
| 5,791,459 | 8/1998 | Hester et al. | 200/512 |

*Primary Examiner*—Michael Horabik
*Assistant Examiner*—Timothy Edwards, Jr.

[57] ABSTRACT

In a keypad for an ATM or the like, in addition to mechanical keys (14) which when operated press areas (24) on a pressure sensitive layer (22) against a backing plate (32), and thereby close a corresponding normally-open switch (S), additional areas (26) are arranged as normally-closed switches A, with pressure applied by protrusions (36) on the backing plate (32). If the backing plate is removed, the switches A open, and the change is sensed by a monitoring circuit (48).

10 Claims, 4 Drawing Sheets

KEYPAD

BACKGROUND OF THE INVENTION

This invention relates to a keypad, especially a keypad allowing entry of confidential information, such as the keypad of an Automated Teller Machine (ATM) into which a user enters a Personal Identity Number (PIN).

A known keypad may comprise a matrix of mechanical keys having on their undersides protrusions which apply pressure, when a key is operated, to a pressure-sensitive membrane, which is held by the keypad against a backing plate.

In an illegal attack on such a keypad, it is known for an attacker to remove the backing plate so as to insert a second pressure-sensitive membrane connected to an illegal recording means, or to tap the scan/return lines between the existing membrane and the other parts of the ATM. In either case, PINs can be deduced from captured data.

To detect such illegal removal of the securing plate, it is common to use one or more microswitches within the ATM casing which operate to provide a warning on removal of the backing plate.

Disadvantages of the use of microswitches are that:

a) Such switches are relatively bulky, and space to locate a switch in an ATM is restricted;

b) There may be mechanical design problems related to mechanical tolerances and variations in switch activation points;

c) Such switches are normally at positions where they are visible from outside the unit, or easily detectable by x-rays or other non-destructive means. Attackers are therefore able to disable or work around a microswitch alarm.

SUMMARY OF THE INVENTION

It is the object of the invention to provide an alarm for a keypad which overcomes the disadvantages of the use of a microswitch alarm.

According to the invention there is now provided a pressure sensitive keypad comprising an array of mechanically-operable keys; adjacent the array a membrane layer having a plurality of pressure-sensitive areas, each said area corresponding to a key and forming a normally-open electrical switch; a rigid backing plate adjacent to the membrane layer arranged so that manual operation of a key causes pressure to be applied to the corresponding pressure-sensitive area so as to close the corresponding switch; and electrical monitoring means arranged to sense said closure; characterized by at least one further pressure-sensitive area on said membrane; pressure means to apply pressure to said further area when the backing plate is correctly positioned to provide a normally-closed electrical switch; and monitoring means to detect when said switch opens.

BRIEF DESCRIPTION OF THE DRAWINGS

The invention will now be described by way of example only with reference to the accompanying drawings in which.

DETAILED DESCRIPTION

Figure 1:
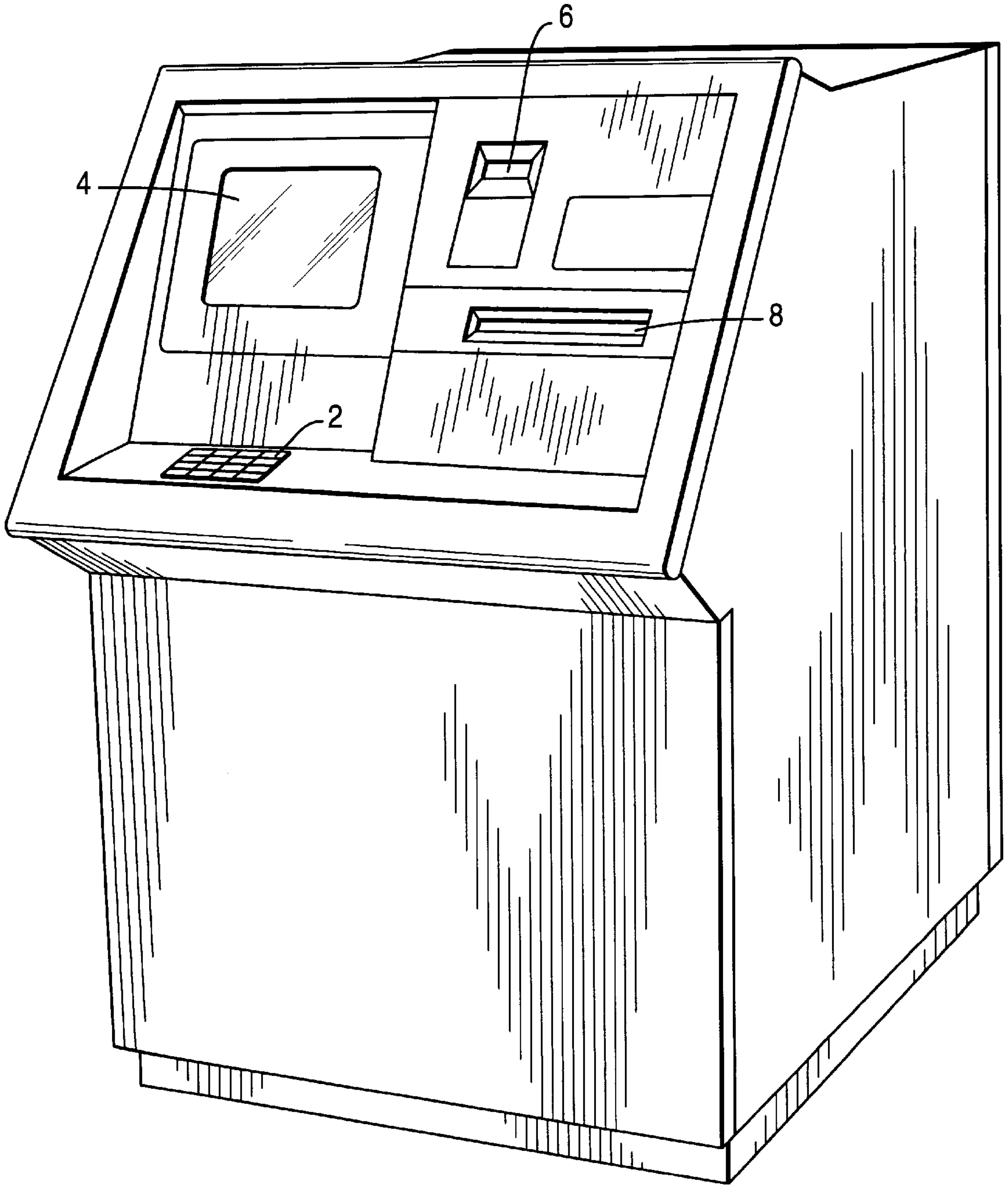
FIG. 1 is a view of an Automated Teller Machine (ATM) incorporating a keypad according to the invention.

In FIG. 1 an ATM has a keypad input 2, a display screen 4, a card input slot 6, and a currency dispense slot 8. In use, a customer inserts a card into the input slot 6 and keys in a PIN by means of the keys 2. The ATM automatically contacts the central authorization point of the financial institution operating the ATM for authorization of the card and PIN; if authorization is confirmed, the customer can request the dispensing of currency notes by the slot 8. The ATM is controlled by a processor (not shown).

As explained above, attacks on ATMs are know in which an attacker captures data and deduces the PINs entered by the keys 2.

Figure 2:
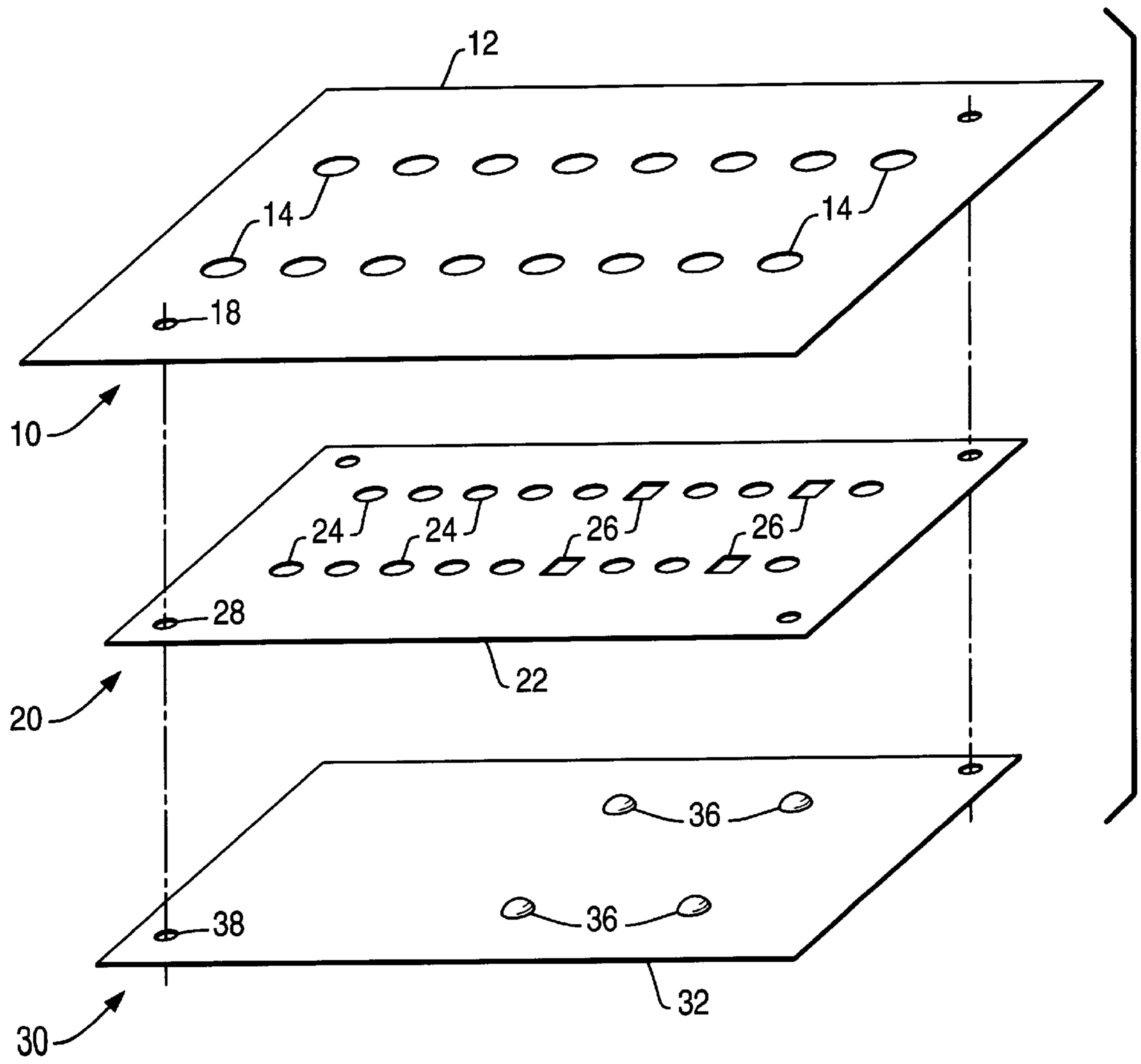
FIG. 2 is an exploded schematic view of a keypad according to the invention.

In FIG. 2, a keypad for an ATM according to the invention comprises a key layer 10 in the form of a molding 12 supporting a 2×8 matrix of mechanically-operable keys. Below the molding 12 is a pressure-sensitive membrane layer 20 comprising a pressure-sensitive membrane 22 having on it a 2×8 matrix of pressure sensitive areas 24 shown as circles and corresponding to the matrix of keys 14, plus four additional pressure sensitive areas 26 shown as rectangles. Below the membrane 22 is a support layer 30 comprising a backing plate 32 having on its surface adjacent the membrane 22 four protrusions 36 positioned to correspond with the four additional pressure sensitive areas 26.

In a variation (not shown) the conventional backing plate is provided with a number of apertures in the positions corresponding to the pressure sensitive areas 26, and an additional backing plate, carrying four protrusions 36, is provided.

The layers 10,20,30 can be clamped together by screws or bolts passing through apertures 18,28,38 at each corner of each layer.

In general operation, when one of the keys 14 is pressed, a protrusion (not shown) on its underside applies pressure to the corresponding pressure sensitive area 24 of the membrane area 22, pressing it against the backing plate 32. Electrically, the normally-open switch corresponding to that key is closed by the pressure, and a monitor circuit identifies the key and passes an appropriate signal to the processor of the ATM.

When the molding 12, membrane 22 and backing plate 32 are fixed together, the protrusions 36 apply pressure to the additional pressure sensitive areas 26, pressing them against the underside of the molding 22. Electrically, four corresponding switches are normally-closed switches. If the backing plate 32 is removed, the pressure is removed and the switches open, allowing an alarm signal to be provided by known techniques.

It is an advantage of such switches incorporated into the pressure sensitive layer that their position cannot easily be determined from outside the ATM.

Figure 3A:
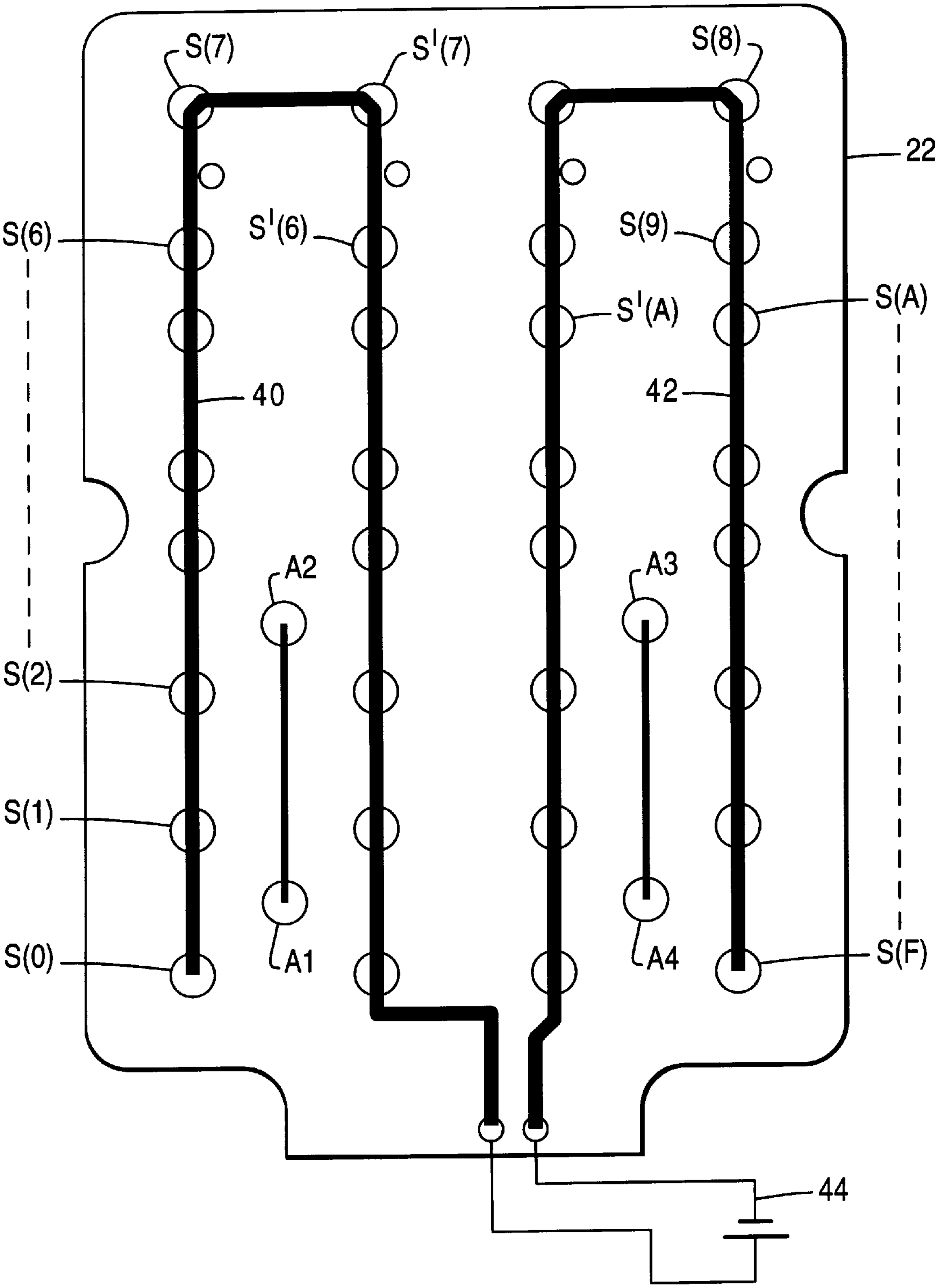
FIGS. 3(*a*) and 3(*b*) are respectively views of the upper and lower surfaces of the membrane layer shown in FIG. 2.
Figure 3B:
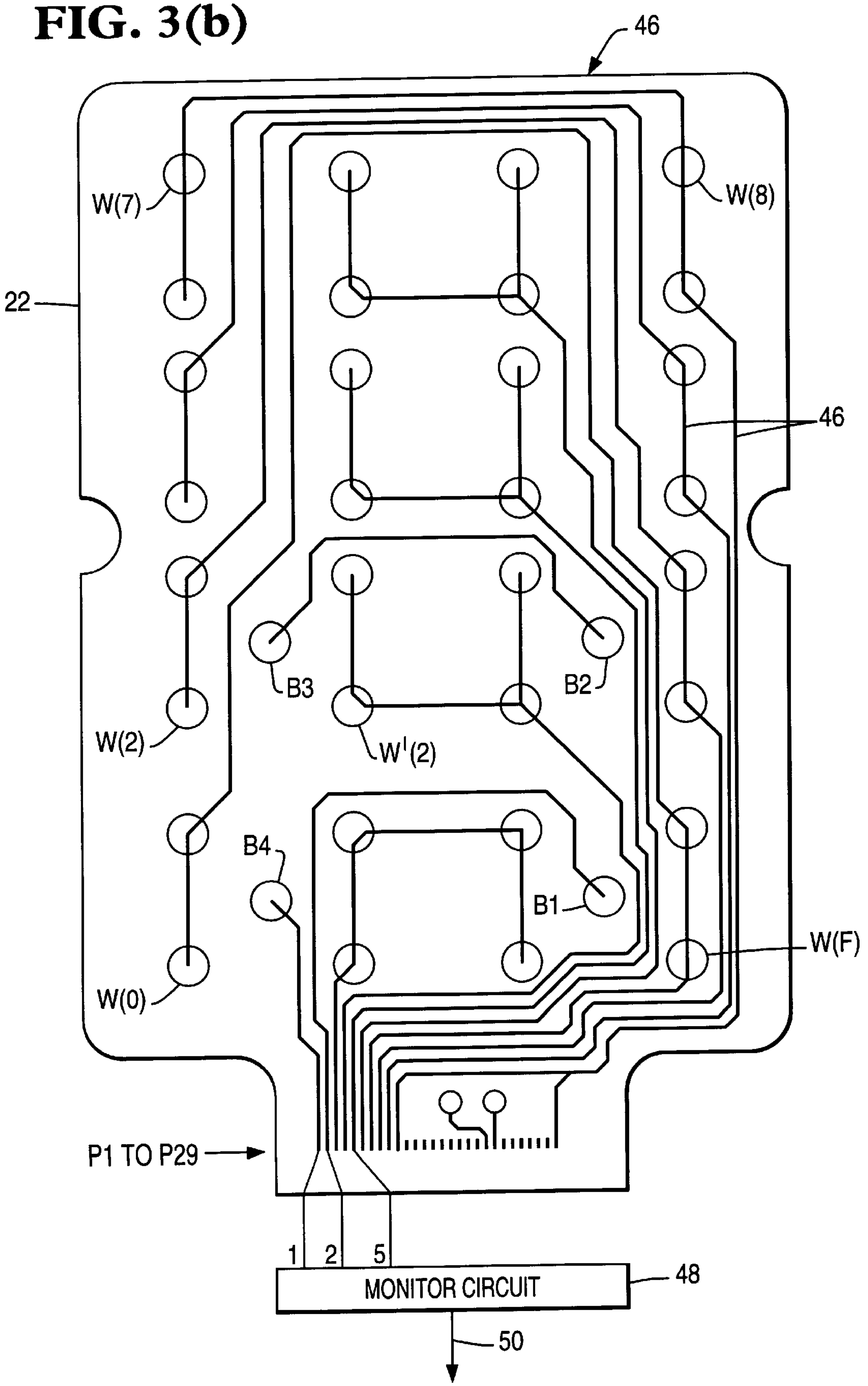

The additional, normally-closed switches can easily be incorporated into the scan matrix conventionally used with an ATM keypad to identify which keys have been pressed. This is illustrated with reference to FIGS. 3(*a*) and 3(*b*) which show the upper and lower surfaces of the membrane 22 in FIG. 2.

FIG. (a) shows the 2×8 matrix of switches, indicated as S(0) to S(F), with each switch having two contact points, such as S(6), S'(6), or S(A), S'(A), to accommodate switch wobble on closure. Each switch is indicated by a circle. The switches in one line of the matrix are connected in series, S(0) to S(7) to S'(7) to S'(0), by a U-shaped conducting track 40, and switches in the other line of the matrix series, S(F) to S'F) are connected by a second U-shaped conducting track 42. One end of the track 40 is connected to one pole of a current source 44, and one end of the track 42 is connected to the other pole.

The four additional switches 26 in FIG. 2 are shown in FIG. (a) as four contact points, A(1) to A(4).

Referring now to FIG. (b), the connections on the lower face of the membrane layer 22 are shown as an array of conductors 46 connecting the contacts shown as circles W corresponding to the positions of the pressure-sensitive switches S on the upper face. The connection pattern is conventional for a 2×8 switch array. The ends of the conductors 46 terminate in twenty-nine connector pins P(1) to P(29) at one edge of the membrane layer. FIG. (b) shows schematically connections between three of the pins P and a monitor circuit 48.

In operation, if a key on the keypad such as key 2 is depressed, the pressure on the membrane layer 22 in the region of switch S(2) closes that switch and causes current to flow from the source 44 along the track 40, through the membrane layer 22 to the contact W(2), and then along the corresponding one of the tracks 46 to the pin P5. Monitor circuit 48 recognizes that key 2 has been depressed, by known techniques, and sends an appropriate signal over a connection 50 to the processor of the ATM. By several keystrokes, a PIN can be entered, recognized, and authorized by conventional techniques.

The four additional switches A1–A4 in FIG. (a) correspond with circles B1–B4 in FIG. (b). The tracks connecting circles B1–B4 are arranged so that the four switches are connected in series between connector pins P1 and P2. As explained above, the switches are normally-closed switches, and the monitor circuit 48 applies a voltage to cause a current to flow through all of the switches.

If the backing plate 32 (FIG. 2) is removed during an attack on an ATM, all of the additional switches open, current ceases to flow, and the monitor circuit 48 sends an appropriate signal to the processor of the ATM which sends an alarm signal to additional security functions (not shown) such as cash destruction or marking, and deletion of confidential data.

The additional switches may be placed at other positions on the membrane layer 22, for example at its corners. Fewer switches, e.g. 2 switches may be used. Whatever the number of additional switches, they may be connected in series to a current source, or in parallel, as convenient.

The keypad may be used in systems other than ATMs when a keypad is likely to be attacked to capture its data input.

What is claimed is:

1. A pressure sensitive keypad comprising:

an array of mechanically operable keys;

a membrane layer adjacent the array of keys and having a plurality of pressure-sensitive areas, each of the pressure-sensitive areas corresponding to a respective key and forming a normally-open electrical switch;

a rigid backing plate adjacent the membrane layer and for allowing pressure to be applied to each pressure-sensitive area of the membrane layer to close the respective normally-open electrical switch when the respective key is manually operated;

the membrane layer including a first pressure-sensitive area;

a protrusion attached to the backing plate and for applying pressure to the first pressure-sensitive area of the membrane layer to provide a first normally-closed electrical switch when the backing plate is correctly positioned relative to the membrane layer; and a monitoring circuit for detecting when the first normally-closed electrical switch opens.

2. A keypad according to claim 1, wherein the membrane layer includes a second pressure-sensitive area separate from the first pressure-sensitive area.

3. A keypad according to claim 2, wherein the a protrusion applies pressure to the second pressure-sensitive area of the membrane layer to provide a second normally-closed electrical switch when the backing plate is correctly positioned relative to the membrane layer.

4. A keypad according to claim 3, wherein the first and second normally-closed electrical switches are connectable in series to an electrical source.

5. A keypad according to claim 3, wherein the first and second normally-closed electrical switches are connectable in parallel across an electrical source.

6. A pressure sensitive keypad comprising:

an array of mechanically operable keys;

a membrane layer adjacent the array of keys and having a plurality of pressure-sensitive areas, each of the pressure-sensitive areas corresponding to a respective key and forming a normally-open electrical switch, the membrane layer including a first pressure-sensitive area;

a first backing plate adjacent the membrane layer and for allowing pressure to be applied to each pressure-sensitive area of the membrane layer to close the respective normally-open electrical switch when the respective key is manually operated;

a second backing plate including a protrusion for applying pressure to the first pressure-sensitive area of the membrane layer to provide a first normally-closed electrical switch when the second backing plate is correctly positioned relative to the membrane layer; and monitoring means for detecting when the first normally-closed electrical switch opens.

7. A keypad according to claim 6, wherein the membrane layer includes a second pressure-sensitive area separate from the first pressure-sensitive area.

8. A keypad according to claim 7, wherein the protrusion of the second backing plate applies pressure to the second pressure-sensitive area of the membrane layer to provide a second normally-closed electrical switch when the second backing plate is correctly positioned relative to the membrane layer.

9. A keypad according to claim 8, wherein the first and second normally-closed electrical switches are connectable in series to an electrical source.

10. A keypad according to claim 8, wherein the first and second normally-closed electrical switches are connectable in parallel across an electrical source.

* * * * *